(12) United States Patent
Takaishi

(10) Patent No.: US 8,860,129 B2
(45) Date of Patent: *Oct. 14, 2014

(54) SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 868 days.

This patent is subject to a terminal disclaimer.

(21) Appl. No.: 12/601,916

(22) PCT Filed: May 30, 2008

(86) PCT No.: PCT/JP2008/060006
§ 371 (c)(1),
(2), (4) Date: Nov. 25, 2009

(87) PCT Pub. No.: WO2008/149799
PCT Pub. Date: Dec. 11, 2008

(65) Prior Publication Data
US 2010/0072546 A1    Mar. 25, 2010

(30) Foreign Application Priority Data

May 30, 2007 (JP) ................................ 2007-143217
Jun. 6, 2007 (JP) ................................ 2007-150444

(51) Int. Cl.
H01L 29/66 (2006.01)
H01L 29/739 (2006.01)
H01L 29/78 (2006.01)
H01L 29/47 (2006.01)
H01L 29/40 (2006.01)

(52) U.S. Cl.
CPC ........ *H01L 29/7828* (2013.01); *H01L 29/7391* (2013.01); *H01L 29/47* (2013.01); *H01L 29/7831* (2013.01); *H01L 29/7839* (2013.01); *H01L 29/407* (2013.01)
USPC .................... 257/330; 257/334; 257/E29.123

(58) Field of Classification Search
USPC .................................. 257/330, 334, E29.123
See application file for complete search history.

(56) References Cited

U.S. PATENT DOCUMENTS

| | | | |
|---|---|---|---|
| 6,400,026 B1 | 6/2002 | Andou et al. | |
| 7,220,661 B1 * | 5/2007 | Yu et al. | 438/570 |
| 8,575,687 B2 * | 11/2013 | Takaishi | 257/330 |
| 2005/0082640 A1 | 4/2005 | Takei et al. | |
| 2006/0011962 A1 * | 1/2006 | Kocon | 257/302 |
| 2006/0017100 A1 * | 1/2006 | Bol et al. | 257/331 |
| 2006/0065924 A1 * | 3/2006 | Yilmaz | 257/328 |
| 2006/0244056 A1 * | 11/2006 | Miura | 257/330 |
| 2010/0176447 A1 | 7/2010 | Takaishi | |

FOREIGN PATENT DOCUMENTS

| | | |
|---|---|---|
| EP | 0 339 962 | 2/1989 |
| JP | 2-15677 | 1/1990 |
| JP | 08-213613 | 8/1996 |
| JP | 2000-332239 | 11/2000 |
| JP | 2001-007149 | 1/2001 |

(Continued)

*Primary Examiner* — Zandra Smith
*Assistant Examiner* — Jamie C Niesz
(74) *Attorney, Agent, or Firm* — Fish & Richardson P.C.

(57) ABSTRACT

Provided is a semiconductor device in which on-resistance is largely reduced. The semiconductor device includes an n type epitaxial layer in which each region between neighboring trenches becomes a channel, and a plurality of embedded electrodes each of which is formed on an inner surface of each trench via a silicon oxide film. By blocking each region between neighboring trenches with every depletion layer formed around each of trenches, current flowing through each region between the neighboring trenches is interrupted. By deleting every depletion layer formed around each of the trenches, current can flow through each region between the neighboring trenches.

9 Claims, 10 Drawing Sheets

(56) References Cited

FOREIGN PATENT DOCUMENTS

| | | |
|---|---|---|
| JP | 2001-168333 | 6/2001 |
| JP | 2003-224277 | 8/2003 |
| JP | 2003-229570 | 8/2003 |
| JP | 2004-356383 | 12/2004 |
| JP | 2005-101551 | 4/2005 |

\* cited by examiner

SEMICONDUCTOR DEVICE

TECHNICAL FIELD

The present invention relates to a semiconductor device, in particular, a semiconductor device having a switching function.

BACKGROUND ART

Conventionally, a metal oxide semiconductor field effect transistor (MOSFET) is known as a semiconductor device having a switching function (see, for example, Patent Document 1). The Patent Document 1 discloses a trench gate MOSFET (semiconductor device) in which a gate electrode is embedded in a trench formed in a semiconductor layer.

FIG. 15 is a cross sectional view illustrating a structure of a conventional MOSFET (semiconductor device) disclosed in the Patent Document 1. As illustrated in FIG. 15, the conventional MOSFET (semiconductor device) includes an $n^+$ type semiconductor substrate 101 and an epitaxial layer (semiconductor layer) 102 formed on the upper surface of the semiconductor substrate 101. This epitaxial layer 102 includes an $n^-$ type impurity region (drain region) 102a, a p type impurity region 102b and an $n^+$ type impurity region (source region) 102c formed in this order from the semiconductor substrate 101 side.

In addition, the epitaxial layer 102 is provided with a trench 103 that is formed so as to penetrate the $n^+$ type impurity region 102c and the p type impurity region 102b and to reach a halfway depth of the $n^-$ type impurity region 102a. A gate electrode 105 is embedded in the trench 103 via a gate insulator film 104. In addition, an interlayer insulator film 106 is formed on the upper surface of the epitaxial layer 102 so as to close the opening end of the trench 103.

In addition, a source electrode 107 is formed on the upper surface of the epitaxial layer 102 so as to cover the interlayer insulator film 106. In addition, a drain electrode 108 is formed on the back surface of the semiconductor substrate 101.

In the conventional MOSFET having the above-mentioned structure, applied voltage to the gate electrode 105 is changed for on-off control.

Specifically, when a predetermined positive potential is applied to the gate electrode 105, minority carrier (electrons) in the p type impurity region 102b is attracted to the trench 103 side, and an inversion layer 109 is formed, which connects the $N^-$ impurity region (drain region) 102a with the $n^+$ type impurity region (source region) 102c. Thus, current can flow between the source electrode 107 and the drain electrode 108 via the inversion layer 109. As a result, the MOSFET is turned on.

In this way, in the conventional MOSFET, the inversion layer 109, which is formed so as to connect the $n^-$ type impurity region (drain region) 102a with the $n^+$ type impurity region (source region) 102c, is made to function as a channel.

In addition, when the application of the predetermined positive potential to the gate electrode 105 is stopped from the above-mentioned state, the inversion layer (channel) 109 disappears so that the current flowing between the source electrode 107 and the drain electrode 108 can be interrupted. As a result, the MOSFET is turned off.

Patent Document 1: JP-A-2001-7149

DISCLOSURE OF THE INVENTION

Problem to be Solved by the Invention

However, in the conventional structure illustrated in FIG. 15, the inversion layer (channel) 109 formed in the turned-on state is very thin, so there is a disadvantage that it is difficult to reduce resistance against the current flowing in the inversion layer (channel) 109. As a result, there is a problem that it is difficult to improve on-resistance.

The present invention is created to solve the above-mentioned problem, and it is an object of the present invention to provide a semiconductor device that can largely reduce on-resistance based on a new principle of operation.

Means for Solving the Problem

In order to achieve the above-mentioned purpose, a semiconductor device according to a first aspect of the present invention includes a semiconductor layer of one conductivity type including a plurality of trenches arranged with predetermined spaces, so that each region between the neighboring trenches becomes a channel, and a plurality of embedded electrodes each of which is formed on an inner surface of each of the plurality of trenches via an insulator film so as to fill in each of the plurality of trenches. Further, each region between the neighboring trenches is blocked with each depletion layer formed around each of the plurality of trenches so that current flowing through each region between the neighboring trenches is interrupted, while each depletion layer formed around each of the plurality of trenches is deleted so that current can flow through each region between the neighboring trenches.

In the semiconductor device according to the first aspect, as described above, by blocking each region between the neighboring trenches (channel) with every depletion layer formed around each of the plurality of trenches, current flowing through each region between the neighboring trenches (channel) is interrupted. In contrast, by deleting each depletion layer formed around each of the plurality of trenches, current can flow through each region between the neighboring trenches (channel). Thus, a formation state of the depletion layer formed around the trench changes in accordance with the applied voltage to the embedded electrode. Therefore, by controlling the applied voltage to the embedded electrode, it is possible to switch from a turned-off state (in which current flowing through each region between the neighboring trenches is interrupted) to a turned-on state (in which current can flow through each region between the neighboring trenches), and to switch in the opposite direction. In other words, the semiconductor device can have a switching function. Further, in the above-mentioned structure, in the turned-on state, the entire part of each region between the neighboring trenches in which the depletion layer is deleted can function as a channel. Therefore, compared with the conventional MOSFET (semiconductor device) in which a very thin inversion layer functions as the channel, resistance against current flowing through the channel can be reduced largely. Thus, compared with the conventional MOSFET (semiconductor device) in which a very thin inversion layer functions as the channel, on-resistance can be reduced largely.

In the semiconductor device according to the first aspect, preferably, a predetermined voltage is applied to the embedded electrode so that the depletion layer formed around the trench is deleted, while the application of the predetermined voltage to the embedded electrode is stopped so that the depletion layer is formed around the trench. With this structure, by controlling the applied voltage to the embedded electrode, it is easy to switch from the turned-off state to the turned-on state and to switch in the opposite direction.

In the semiconductor device according to the first aspect, preferably, when the current flowing through each region between the neighboring trenches is interrupted, the depletion layers formed around the neighboring trenches are connected to each other. With this structure, each region between the neighboring trenches (channel) can be blocked with the depletion layer securely in the turned-off state.

In the semiconductor device according to the first aspect, preferably, a distance between the neighboring trenches is set so that the depletion layers formed around the neighboring trenches are overlapped with each other. With this structure, the depletion layers formed around the neighboring trenches can easily be connected to each other.

Preferably, the semiconductor device according to the first aspect further comprises an electrode layer formed on an upper surface of the semiconductor layer so as to over an opening end of the trench, and an interlayer insulator film for insulating between the embedded electrode and the electrode layer. The embedded electrode is filled in the trench to a halfway depth, and the interlayer insulator film fills in the remaining part of the trench in which the embedded electrode is not filled in, so that an upper surface of the interlayer insulator film becomes flush with the upper surface of the semiconductor layer. It is to be understood that, throughout the present specification and the appended claims, "halfway" means "anywhere along the given distance (depth)" without limitation to, but not excluding, exact or close equidistance from the ends. With this structure, even if the distance between the neighboring trenches is made to be small, the part of the semiconductor layer on the upper surface side (upper end portion of the region between the neighboring trenches) is not entirely covered with the interlayer insulator film. Thus, the distance between the neighboring trenches can be reduced, so that the depletion layers formed around the neighboring trenches can easily be connected to each other.

The semiconductor device according to the second aspect of the present invention includes a semiconductor layer of one conductivity type including a plurality of trenches arranged with predetermined spaces, each of the trenches having an opening end positioned on an upper surface side, so that each region between the neighboring trenches becomes a current passage, a plurality of embedded electrodes each of which is formed on an inner surface of each of the plurality of trenches via an insulator film so as to fill in each of the plurality of trenches in the semiconductor layer, and an electrode layer disposed on one of an upper surface and a lower surface of the semiconductor layer so as to have a Schottky contact with the semiconductor layer. Further, each region between the neighboring trenches in the semiconductor layer is blocked with a depletion layer formed around the trench so that current is interrupted, while at least a part of the depletion layer formed around the trench is deleted so that current can flow. If the electrode layer is formed on the upper surface side of the semiconductor layer, the electrode layer has the Schottky contact with the upper surface of each region between the neighboring trenches in the semiconductor layer, while if the electrode layer is formed on the lower surface side of the semiconductor layer, the electrode layer has the Schottky contact with the lower surface of the semiconductor layer. Note that the semiconductor layer of the present invention includes a semiconductor substrate.

In the semiconductor device according to the second aspect, as described above, each region between the neighboring trenches in the semiconductor layer is blocked with the depletion layer formed around the trench so that the current is interrupted. In contrast, at least a part of the depletion layer formed around the trench is deleted so that current can flow. Thus, a formation state of the depletion layer formed around the trench changes in accordance with the applied voltage to the embedded electrode. Therefore, by controlling the applied voltage to the embedded electrode, it is possible to switch from the turned-on state (in which current flows through each region between the neighboring trenches in the semiconductor layer) to the turned-off state (in which current flowing through each region between the neighboring trenches in the semiconductor layer is interrupted) and to switch in the opposite direction. In other words, the semiconductor device can have a switching function. Further, in the above-mentioned structure, in the turned-on state, the entire part of each region between the neighboring trenches in the semiconductor layer in which the depletion layer is deleted can function as the current passage, compared with the conventional MOSFET (semiconductor device) in which a very thin inversion layer functions as the channel (current passage), resistance against current can be reduced largely. Thus, compared with the conventional MOSFET (semiconductor device) in which a very thin inversion layer functions as the channel (current passage), on-resistance can be reduced largely.

In addition, in the semiconductor device according to the second aspect, as described above, the electrode layer having the Schottky contact with the semiconductor layer is formed on one of an upper surface and a lower surface of the semiconductor layer. If the electrode layer is formed on the upper surface side of the semiconductor layer, the electrode layer has the Schottky contact with the upper surface of each region between the neighboring trenches in the semiconductor layer. In contrast, if the electrode layer is formed on the lower surface side of the semiconductor layer, the electrode layer has the Schottky contact with the lower surface of the semiconductor layer. Thus, the Schottky barrier diode can be formed on the upper surface side of each region between the neighboring trenches in the semiconductor layer or the lower surface side of the semiconductor layer. Here, if an ohmic contact is formed between the electrode layer and the semiconductor layer, it is required that impurity concentration of the region of the semiconductor layer to contact with the electrode layer should be high concentration. In contrast, if the Schottky contact is formed between the electrode layer and the semiconductor layer, the impurity concentration of the region of the semiconductor layer to contact with the electrode layer may remain to be low concentration. Therefore, when the Schottky barrier diode is formed, the step of doping impurity into the semiconductor layer at high concentration is not necessary, so that manufacturing steps can be reduced. In other words, by forming the Schottky barrier diode, the semiconductor device can be manufactured at low cost.

In addition, in the above-mentioned structure, each region between the neighboring trenches in the semiconductor layer can be blocked with the depletion layer formed around the trench, so current flowing in the Schottky barrier diode can be interrupted. Thus, occurrence of leak current in the Schottky barrier diode can be suppressed. In contrast, if the depletion layer formed around the trench is deleted, current can flow in the Schottky bather diode. As a result, by controlling on and off of the semiconductor device, current flowing in the Schottky barrier diode can be controlled.

In the semiconductor device according to the second aspect, preferably, the electrode layer includes at least a barrier metal layer contacting with the semiconductor layer. With this structure, the electrode layer can have the Schottky contact appropriately with the semiconductor layer, so that the Schottky barrier diode can easily be formed.

In the semiconductor device according to the second aspect, preferably, a distance between the neighboring trenches is set so that the depletion layers formed around the neighboring trenches are overlapped with each other. With this structure, the depletion layers formed around the neighboring trenches can be connected to each other securely.

Preferably, the semiconductor device according to the second aspect further includes an interlayer insulator film formed on an upper surface of the embedded electrode. The embedded electrode is filled in the trench to a halfway depth, and the interlayer insulator film is filled in the remaining part of the trench in which the embedded electrode is not filled in, so that an upper surface of the interlayer insulator film becomes flush with the upper surface of the semiconductor layer. With this structure, even if the distance between the neighboring trenches is made to be small, the part of the semiconductor layer on the upper surface side (upper end portion of the region between the neighboring trenches in the semiconductor layer) is not entirely covered with the interlayer insulator film. Thus, the distance between the neighboring trenches can be reduced, so that the depletion layers formed around the neighboring trenches can easily be connected to each other.

Effects of the Invention

As described above, according to the present invention, the semiconductor device that can largely reduce on-resistance based on a new principle of operation can be obtained easily.

EXPLANATION OF NUMERALS

Figure 1:
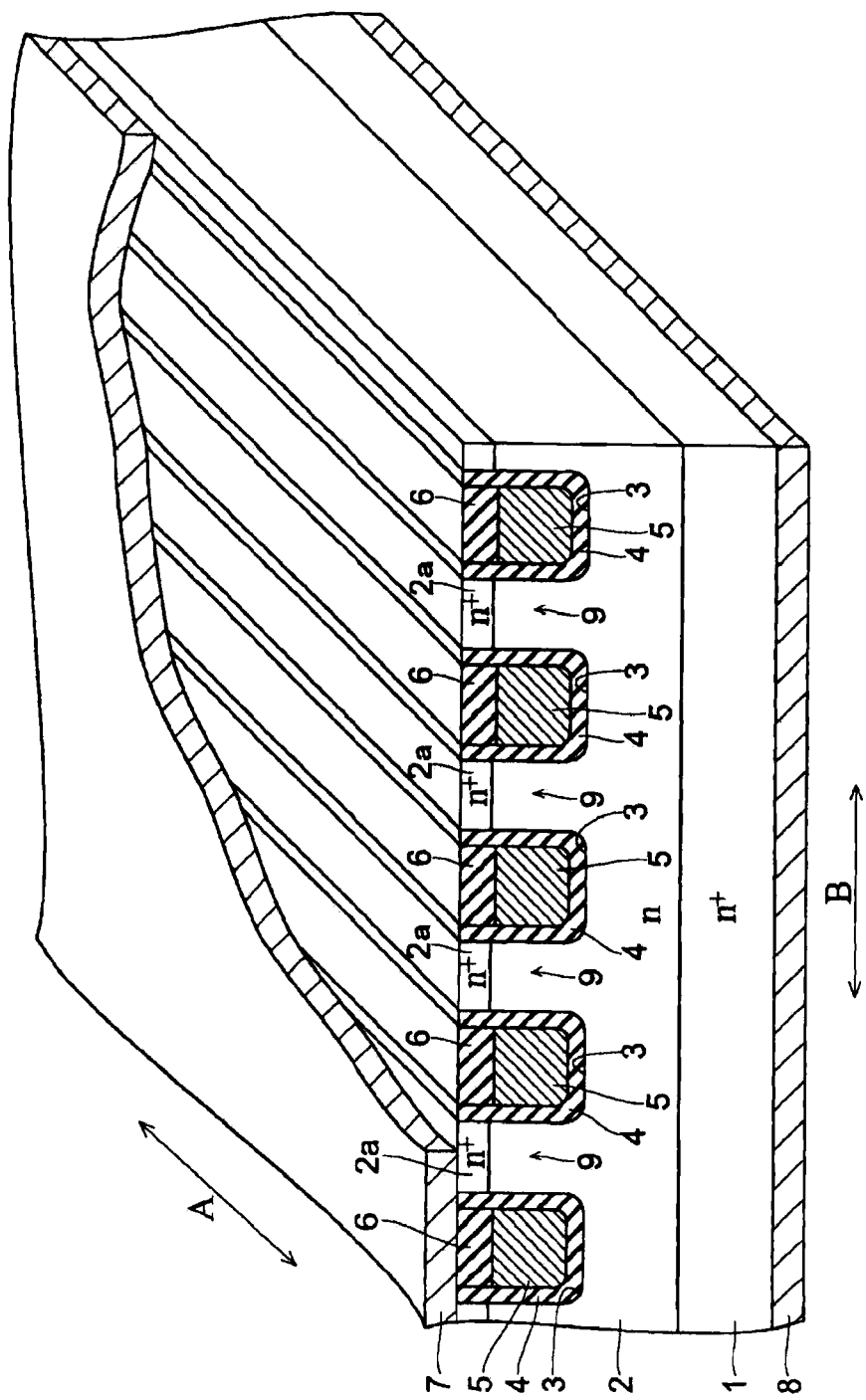
FIG. 1 is a cross sectional perspective view illustrating a semiconductor device according to a first embodiment of the present invention.

1 $n^+$ type silicon substrate (semiconductor layer)
2 n type epitaxial layer (semiconductor layer)
3, 12, 12a, 12b trench
4, 13 silicon oxide film (insulator film)
5, 14, 14a, 14b embedded electrode
6, 15 interlayer insulator film
7 source electrode (electrode layer)
9, 18 channel
10, 19, 19a, 19b depletion layer
11 n type silicon substrate (semiconductor layer)
17 drain electrode (electrode layer)
17a barrier metal layer
20, 30, 40 semiconductor device

BEST MODE FOR CARRYING OUT THE INVENTION

First Embodiment

Hereinafter, a structure of a semiconductor device according to first embodiment will be described with reference to FIGS. 1 and 2. Note that the semiconductor device of the first embodiment is structured to function as a normally-off type switch device.

Figure 2:
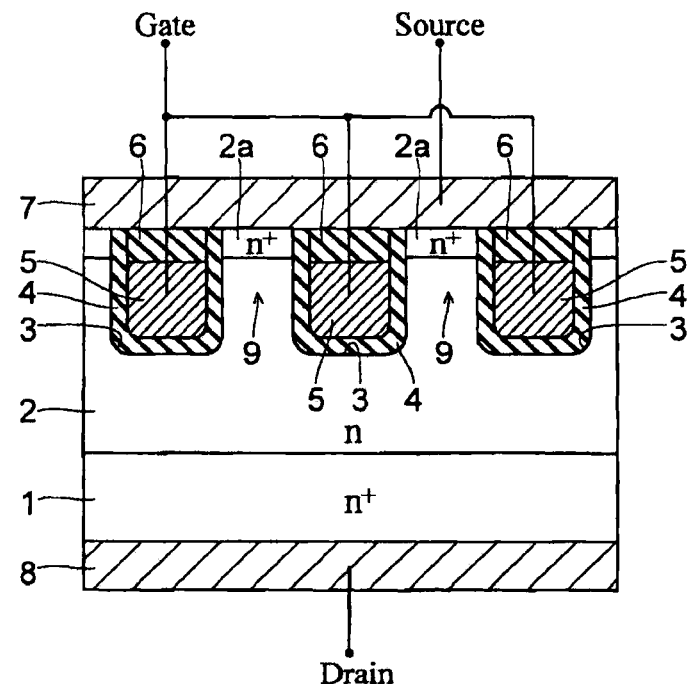
FIG. 2 is a cross sectional view illustrating connection positions of embedded electrodes of the semiconductor device according to a first embodiment illustrated in FIG. 1.

In the semiconductor device of the first embodiment, as illustrated in FIGS. 1 and 2, an n type epitaxial layer 2 made of n type silicon having a thickness of approximately 1 to 10 μm is formed on an upper surface of an $n^+$ type silicon substrate 1. An n type impurity is doped into the $n^+$ type silicon substrate 1 at a high concentration so that a good ohmic contact is obtained with the drain electrode 8 that will be described later. In addition, an n type impurity is doped into the n type epitaxial layer 2 at a concentration (approximately $5 \times 10^{15}$ to $1 \times 10^{18}$ cm$^{-3}$) that is lower than the concentration in the $n^+$ type silicon substrate 1. Note that the $n^+$ type silicon substrate 1 and the n type epitaxial layer 2 is an example of the "semiconductor layer of one conductivity type" in the present invention.

In addition, the n type epitaxial layer 2 has a plurality of trenches 3 dug in the thickness direction. The plurality of trenches 3 are formed by etching predetermined regions of the n type epitaxial layer 2 from the upper surface (principal surface) side. In other words, opening ends of the plurality of trenches 3 are positioned on the upper surface of the n type epitaxial layer 2.

In addition, each of the plurality of trenches 3 is formed in an elongated shape so as to extend in a predetermined direction (A direction) that is parallel to the upper surface of the n type epitaxial layer 2. In addition, the plurality of trenches 3 are arranged in the direction (B direction) that is parallel to the upper surface of the n type epitaxial layer 2 and is perpendicular to the extending direction of the trench 3 (A direction) with spaces of approximately 0.05 to 0.3 μm between them. Further, the depth of each of the plurality of trenches 3 is set to approximately 0.5 to 5 μm that is smaller than the thickness of the n type epitaxial layer 2 (approximately 1 to 10 μm). In addition, the width of each of the plurality of trenches 3 in the B direction is set to approximately 0.1 to 1 μm.

In addition, on the inner surface of each of the plurality of trenches 3, there is formed a silicon oxide film 4 obtained by thermal oxidation process of the n type silicon constituting the n type epitaxial layer 2, at a thickness of approximately 10 to 100 nm. Note that the silicon oxide film 4 is an example of the "insulator film" in the present invention.

In addition, on the inner surface of each of the plurality of trenches 3, there is formed an embedded electrode (gate electrode) 5 made of p type polysilicon via the silicon oxide film 4. The plurality of embedded electrodes (gate electrodes) 5 are electrically connected to each other so that the same voltage is applied to them. In addition, each of the plurality of embedded electrodes (gate electrodes) 5 is filled in the corresponding trench 3 to a halfway depth thereof. It is to be understood that, throughout the present specification and the appended claims, "halfway" means "anywhere along the given distance (depth)" without limitation to, but not excluding, exact or close equidistance from the ends. Note that a metal or the like can be used instead of the p type polysilicon as a structural material of the embedded electrode (gate electrode) 5.

In the first embodiment, the plurality of embedded electrodes (gate electrodes) 5 are disposed as described above, so as to control the applied voltage to the plurality of embedded electrodes (gate electrodes) 5. Thus, it is possible to form a depletion layer around each of the plurality of trenches 3 or to delete the formed depletion layer. Further, in the first embodiment, the distance between the neighboring trenches 3 is set so that when the depletion layer is formed around each of the plurality of trenches 3, the depletion layers formed around neighboring trenches 3 are overlapped with each other. In other words, when the depletion layer is formed around each of the plurality of trenches 3, the depletion layers formed around neighboring trenches 3 are connected to each other. Therefore, in the first embodiment, when the depletion layer is formed around each of the plurality of trenches 3, each region between the neighboring trenches 3 can be blocked with the depletion layer.

In addition, an interlayer insulator film 6 made of a silicon oxide film is embedded in the remaining part that is not filled with the embedded electrode (gate electrode) 5 of each of the plurality of trenches 3 (part over the embedded electrode 5). Each of the plurality of interlayer insulator films 6 is provided for insulating between the corresponding embedded electrode (gate electrode) 5 and a source electrode 7 that will be described later. In addition, the thickness of each of the plurality of interlayer insulator films 6 is set to be the same as the depth of the remaining part that is not filled with the embedded electrode (gate electrode) 5 of the corresponding trench 3 (part over the embedded electrode 5). Therefore, the upper surface of each of the plurality of interlayer insulator films 6 is flush with the upper surface of the n type epitaxial layer 2 (upper surface of the upper end portion of each region between neighboring trenches 3).

In addition, on the upper surface portion of the n type epitaxial layer 2 (upper end portion of each region between the neighboring trenches 3), there is formed a high concentration region 2a in which the n type impurity is doped at high concentration by ion injection so that a low concentration region is not exposed on the upper surface of the n type epitaxial layer 2. The concentration of the high concentration region 2a of the n type epitaxial layer 2 is set so that a good ohmic contact can be obtained with the source electrode 7 that will be described later, and is higher than concentration in other part of the n type epitaxial layer 2. In addition, the thickness of the high concentration region 2a in the n type epitaxial layer 2 (depth of the ion injection) is set to be smaller than the thickness of the interlayer insulator film 6. In other words, the lower end portion of the high concentration region 2a in the n type epitaxial layer 2 is positioned higher than the upper end portion of the embedded electrode 5.

In addition, on the upper surface of the n type epitaxial layer 2, there is formed the source electrode 7 made of an aluminum layer so as to cover the opening ends of the plurality of trenches 3. This source electrode 7 has an ohmic contact with the high concentration region 2a of the n type epitaxial layer 2 (upper end portion of each region between the neighboring trenches 3). Note that the source electrode 7 is an example of the "electrode layer" in the present invention. In addition, on the back surface of the $n^+$ type silicon substrate 1, there is formed a drain electrode 8 constituted of a multilayer structure including a plurality of laminated metal layers. This drain electrode 8 has an ohmic contact with the $n^+$ type silicon substrate 1.

In the structure described above, when a voltage is applied between the source electrode 7 and the drain electrode 8, current flowing between the source electrode 7 and the drain electrode 8 (current flowing in the thickness direction of the n type epitaxial layer 2) passes through each regions between the neighboring trenches 3 of the n type epitaxial layer 2. In other words, in the structure described above, each region between the neighboring trenches 3 in the n type epitaxial layer 2 functions as a channel 9.

Figure 3:
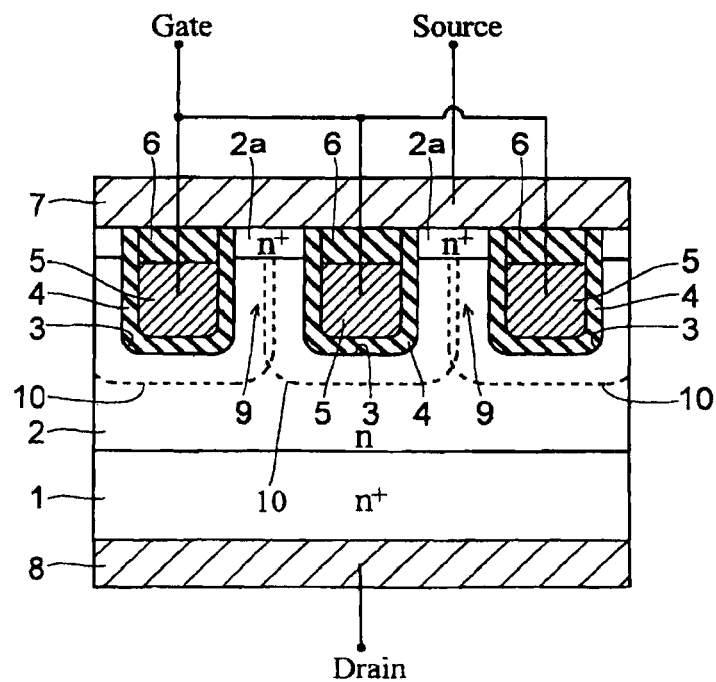
FIG. 3 is a cross sectional view illustrating an operation of the semiconductor device according to the first embodiment of the present invention.
Figure 4:
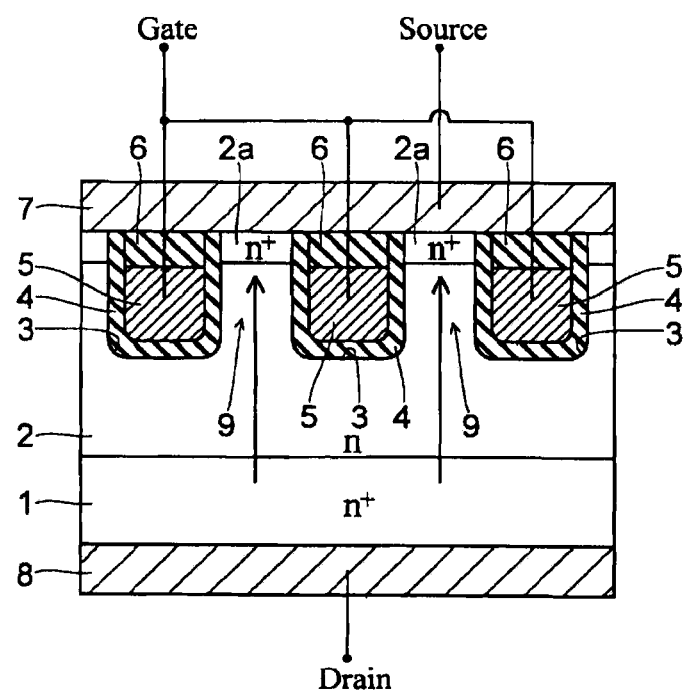
FIG. 4 is a cross sectional view illustrating an operation of the semiconductor device according to the first embodiment of the present invention.

Next, with reference to FIGS. 3 and 4, an operation of the semiconductor device that functions as a switch device of the first embodiment will be described. FIG. 3 illustrates the case where the semiconductor device that functions as a switch device is turned off, and FIG. 4 illustrates the case where the semiconductor device that functions as a switch device is turned on.

Note that it is supposed in the following description that a negative potential is applied to the source electrode 7, and a positive potential is applied to the drain electrode 8. In other words, if the semiconductor device that functions as a switch device is turned on, current flows from the drain electrode 8 to the source electrode 7 (in the arrow direction in FIG. 4).

First, if the semiconductor device that functions as a switch device is turned off, as illustrated in FIG. 3, the applied voltage to the embedded electrode (gate electrode) 5 is controlled so that majority carrier existing in a periphery of the trench 3 filled with the embedded electrode (gate electrode) 5 is decreased. In this way, a depletion layer 10 is formed in the periphery of the trench 3.

In this case, in the region between the neighboring trenches 3, the depletion layers 10 formed around the neighboring trenches 3 are overlapped with each other. In other words, in the region between the neighboring trenches 3, the depletion layers 10 formed around the neighboring trenches 3 are connected to each other. Thus, the channel 9 is blocked with the depletion layer 10, so that the current flowing in the channel 9 can be interrupted. Therefore, the semiconductor device that functions as a switch device is turned off.

Next, if the semiconductor device that functions as a switch device is to be switched from the turned-off state to the turned-on state, as illustrated in FIG. 4, a predetermined positive potential (predetermined voltage) is applied to the embedded electrode (gate electrode) 5 so that the depletion layer 10 formed around the trench 3 (see FIG. 3) is deleted. In other words, the depletion layer 10 that blocks the channel 9 (see FIG. 3) is deleted. Thus, current can flow through the channel 9, so that the semiconductor device that functions as a switch device can be turned on.

In addition, if the semiconductor device that functions as a switch device is to be switched from the turned-on state to the turned-off state, the application of predetermined positive potential (predetermined voltage) to the embedded electrode (gate electrode) 5 is stopped. Thus, the state illustrated in FIG. 3 is restored, so that the semiconductor device that functions as a switch device can be turned off.

In the first embodiment, as described above, the channel 9 (each region between the neighboring trenches 3) is blocked in every depletion layer 10 formed around each of the plurality of trenches 3, so that current flowing in the channel 9 (each region between the neighboring trenches 3) is interrupted. On the other hand, all the depletion layers 10 formed around the plurality of trenches 3 are deleted so that current can flow through the channel 9 (each region between the neighboring trenches 3). Thus, a formation state of the depletion layer 10 that is formed around the trench 3 changes in accordance with the applied voltage to the embedded electrode 5. Therefore, by controlling the applied voltage to the embedded electrode 5, it is possible to switch from the turned-off state (in which current flowing through the channel 9 is interrupted) to the turned-on state (in which current flows through the channel 9) and to switch in the opposite direction. In other words, the semiconductor device can have the switching function. Further, in the above-mentioned structure, the entire portion of each region between the neighboring trenches 3 in which the depletion layer 10 is deleted can function as the channel 9 in the turned-on state, so the resistance against the current flowing through the channel 9 can be largely reduced compared with the conventional MOSFET (semiconductor device) in which a very thin inversion layer functions as the channel. Thus, the on-resistance can be largely reduced compared with the conventional MOSFET (semiconductor device) in which a very thin inversion layer functions as the channel.

In addition, in the first embodiment, as described above, the depletion layer 10 formed around the trench 3 is deleted by applying the predetermined positive potential to the embedded electrode (gate electrode) 5, and the depletion layer 10 is formed around the trench 3 by stopping the application of the predetermined positive potential to the embedded electrode (gate electrode) 5. Thus, by controlling the applied voltage to the embedded electrode (gate electrode) 5, it is easy to switch from the turned-off state to the turned-on state and to switch in the opposite direction.

In addition, in the first embodiment, as described above, the depletion layers 10 formed around neighboring trenches 3 are connected to each other in the turned-off state, so that the channel 9 (each region between the neighboring trenches 3) can be securely blocked with the depletion layer 10.

In addition, in the first embodiment, as described above, the distance between the neighboring trenches 3 is set so that the depletion layers 10 formed around neighboring trenches 3 are overlapped with each other, so that the depletion layers 10 formed around neighboring trenches 3 can be connected easily to each other.

In addition, in the first embodiment, as described above, the interlayer insulator film 6 is embedded in the trench 3 so that the upper surface of the interlayer insulator film 6 becomes flush with the upper surface of the n type epitaxial layer 2. Thus, even if the distance between the neighboring trenches 3 is made to be small, the part of the n type epitaxial layer 2 on the upper surface side (upper end portion of the region between the neighboring trenches 3) is not entirely covered with the interlayer insulator film 6. Thus, the distance between the neighboring trenches 3 can be reduced, so that the depletion layers 10 formed around neighboring trenches 3 can easily be connected with each other.

Second Embodiment

Next, with reference to FIGS. 5 to 7, a structure of a semiconductor device 20 according to a second embodiment of the present invention will be described. Note that the semiconductor device 20 according to the second embodiment is structured to function as a normally-off type switch device. In addition, FIG. 7 illustrates an equivalent circuit of the semiconductor device 20 according to the second embodiment with circuit symbols that are generally used for MOSFETs for convenience' sake.

Figure 5:
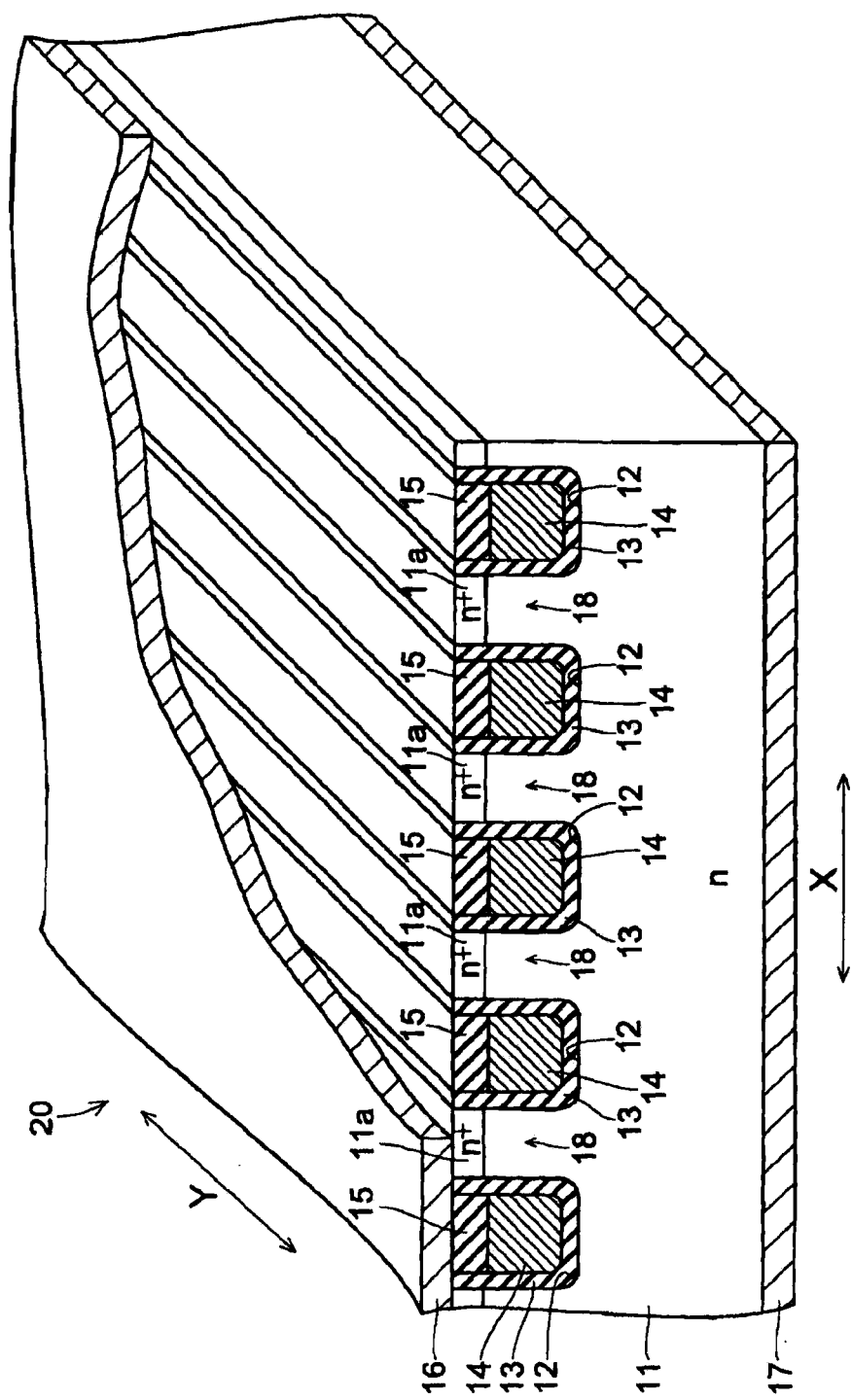
FIG. 5 is a cross sectional perspective view of a semiconductor device according to a second embodiment of the present invention.
Figure 6:
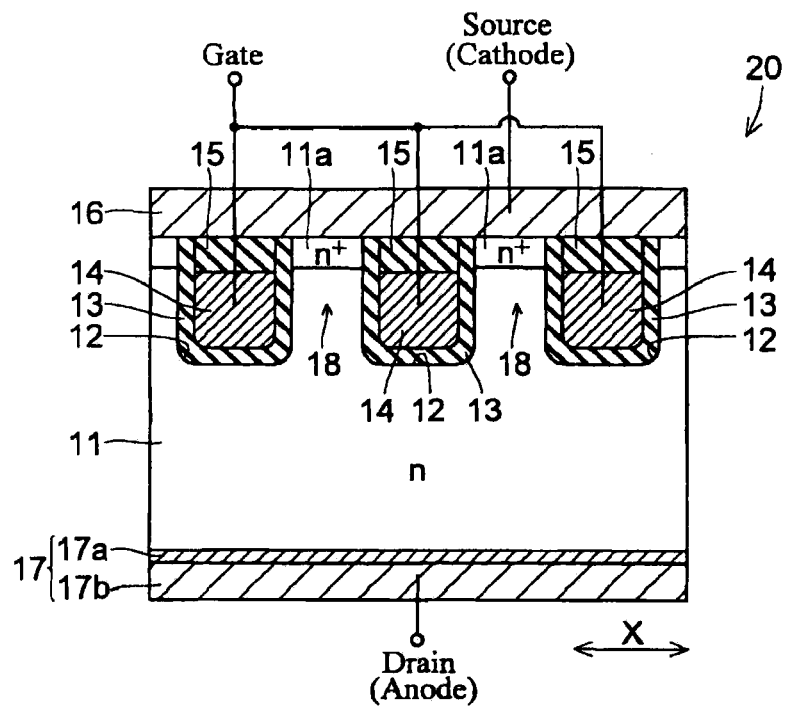
FIG. 6 is a cross sectional view illustrating connection positions of embedded electrodes of the semiconductor device according to the second embodiment illustrated in FIG. 5.
Figure 7:
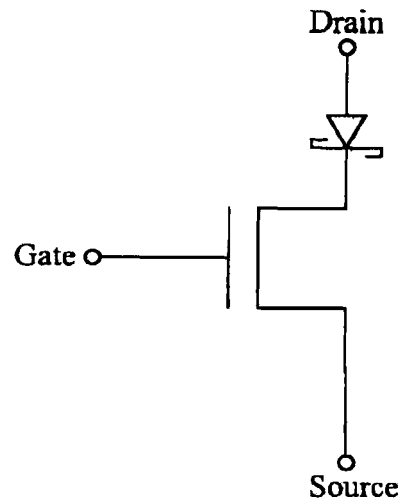
FIG. 7 is an equivalent circuit diagram of the semiconductor device according to second embodiment illustrated in FIG. 5.

As illustrated in FIGS. 5 and 6, the semiconductor device 20 according to the second embodiment includes an n type silicon substrate 11 having a thickness of approximately 10 μm in which n type impurity is doped at a low concentration (e.g., approximately $5 \times 10^{15}$ to $1 \times 10^{18}$ cm$^{-3}$) and a plurality of trenches 12 formed in the n type silicon substrate 11. The plurality of trenches 12 are formed by etching predetermined regions of the n type silicon substrate 11 in the thickness direction from the upper surface (principal surface) side. In other words, each of opening ends of the plurality of trenches 12 is positioned on the upper surface of the n type silicon substrate 11. Note that the n type silicon substrate 11 is an example of the "semiconductor layer of one conductivity type" in the present invention.

In addition, each of the plurality of trenches 12 is formed in an elongated shape so as to extend in a predetermined direction (Y direction) that is parallel to the upper surface of the n type silicon substrate 11. In addition, the plurality of trenches 12 are arranged in the direction (X direction) that is parallel to the upper surface of the n type silicon substrate 11 and is perpendicular to the extending direction of the trench 12 (Y direction) with spaces of approximately 0.05 to 0.3 μm. Further, the depth of each of the plurality of trenches 12 is set to approximately 0.5 to 5 μm. In addition, the width of each of the plurality of trenches 3 in the X direction is set to approximately 0.1 to 1 μm.

In addition, on the inner surface of each of the plurality of trenches 12, there is formed a silicon oxide film 13 obtained by thermal oxidation process of the n type silicon constituting the n type silicon substrate 11, at a thickness of approximately 10 to 100 nm. Note that the silicon oxide film 13 is an example of the "insulator film" in the present invention.

In addition, on the inner surface of each of the plurality of trenches 12, there is formed an embedded electrode (gate electrode) 14 made of p type polysilicon via the silicon oxide film 13. As illustrated in FIG. 6, the plurality of embedded electrodes (gate electrodes) 14 are electrically connected to each other so that the same voltage is applied to them. In addition, each of the plurality of embedded electrodes (gate electrodes) 14 is embedded to a halfway depth of the corresponding trench 12. Note that a metal or the like can be used instead of the p type polysilicon as a structural material of the embedded electrode (gate electrode) 14.

In the second embodiment, the plurality of embedded electrodes (gate electrodes) 14 are disposed as described above, so as to control the applied voltage to the plurality of embedded electrodes (gate electrodes) 14. Thus, it is possible to form a depletion layer around each of the plurality of trenches 12 or to delete the formed depletion layer. Then, in the second embodiment, the distance between the neighboring trenches 12 is set so that when the depletion layer is formed around each of the plurality of trenches 12, the depletion layers formed around neighboring trenches 12 are overlapped with each other. In other words, when the depletion layer is formed around each of the plurality of trenches 12, the depletion layers formed around neighboring trenches 12 are connected to each other. Therefore, in the second embodiment, the depletion layer is formed around each of the plurality of trenches 12, so that each region between the neighboring trenches 12 can be blocked with the depletion layer.

In addition, as illustrated in FIGS. 5 and 6, an interlayer insulator film 15 made of a silicon oxide film is embedded in the remaining part that is not filled with the embedded electrode (gate electrode) 14 of each of the plurality of trenches 12 (part over the embedded electrode 14). Each of the plurality of interlayer insulator films 15 is provided for insulating between the corresponding embedded electrode (gate electrode) 14 and a source electrode 16 that will be described later. In addition, the thickness of each of the plurality of interlayer insulator films 15 is set to be the same as the depth of the remaining part that is not filled with the embedded electrode (gate electrode) 14 of the corresponding trench 12 (part over the embedded electrode 14). Therefore, the upper surface of each of the plurality of interlayer insulator films 15 is flush with the upper surface of the n type silicon substrate 11 (upper surface of the upper end portion of each region between the neighboring trenches 12).

In addition, on the upper surface portion of the n type silicon substrate 11 (upper end portion of each region between the neighboring trenches 12), there is formed a high concentration region 11a in which the n type impurity is doped at high concentration by ion injection so that a low concentration region is not exposed on the upper surface of the n type silicon substrate 11. The high concentration region 11a of the n type silicon substrate 11 is set so that a good ohmic contact can be obtained with the source electrode 16 that will be described later, and is higher than concentration in other part of the n type silicon substrate 11. In addition, the thickness of the high concentration region 11a in the n type silicon substrate 11 (depth after diffusion by the ion injection) is set to be smaller than the thickness of the interlayer insulator film 15. In other words, the lower end portion of the high concentration region 11a of the n type silicon substrate 11 is positioned higher than the upper end portion of the embedded electrode (gate electrode) 14.

In addition, on the upper surface of the n type silicon substrate 11, there is formed the source electrode 16 made of an aluminum layer so as to cover the opening ends of the plurality of trenches 12. This source electrode 16 has an ohmic contact with the high concentration region 1a of the n type silicon substrate 11 (upper end portion of each region between the neighboring trenches 12). In addition, on the lower surface (back surface) of the n type silicon substrate 11, there is formed a drain electrode 17. Note that the drain electrode 17 is an example of the "electrode layer" in the present invention.

Here, in the second embodiment, the drain electrode 17 is formed so as to have a Schottky contact with the lower surface (back surface) of the n type silicon substrate 11. Specifically, the lower surface (back surface) of the n type silicon substrate 11 is a low concentration region, and the drain electrode 17 is formed on the lower surface (back surface) of the n type silicon substrate 11 so as to contact with the low concentration region. In addition, the drain electrode 17 is constituted of a multilayer structure including a plurality of laminated metal layers. Specifically, the drain electrode 17 includes a barrier metal layer 17a made of TiN or the like, and another metal layer 17b. In addition, the barrier metal layer 17a is disposed on the side of the multilayer structure closest to the n type silicon substrate 11 and is formed so that the entire upper surface thereof contacts directly with the lower surface (back surface) of the n type silicon substrate 11. Thus, in the semiconductor device 20 according to the second embodiment, a Schottky barrier diode having the drain electrode 17 as an anode electrode is formed on the lower surface side of the n type silicon substrate 11. Then, the semiconductor device 20 according to the second embodiment having the above-mentioned structure can be represented by the equivalent circuit as illustrated in FIG. 7.

In the structure described above, when a voltage is applied between the source electrode 16 and the drain electrode 17, current flowing between the source electrode 16 and the drain electrode 17 (current flowing in the thickness direction of the n type silicon substrate 11) passes through each region between the neighboring trenches 12 in the n type silicon substrate 11. In other words, in the structure described above, each region between the neighboring trenches 12 in the n type silicon substrate 11 functions as a channel 18.

Figure 8:
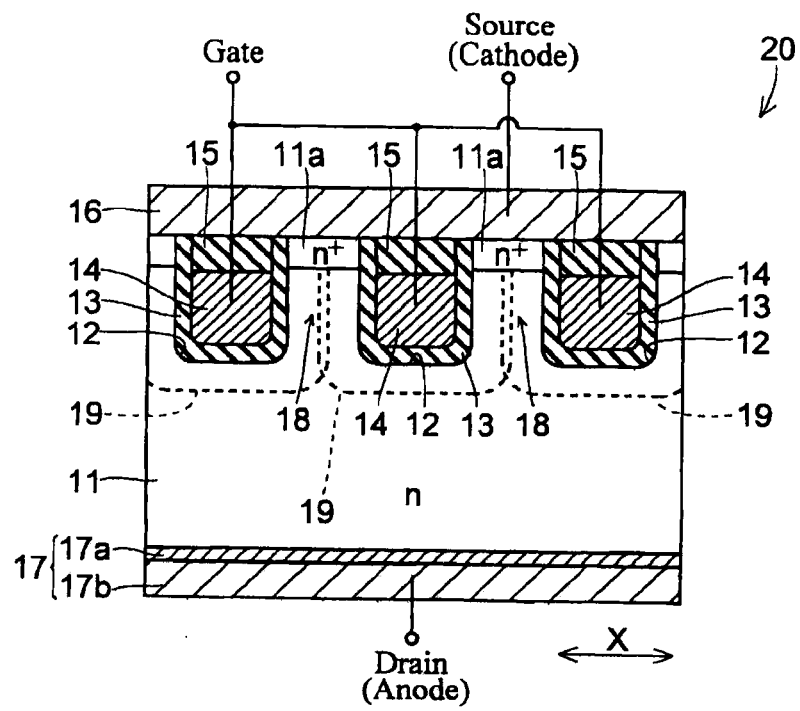
FIG. 8 is a cross sectional view illustrating an operation of the semiconductor device according to the second embodiment of the present invention.
Figure 9:
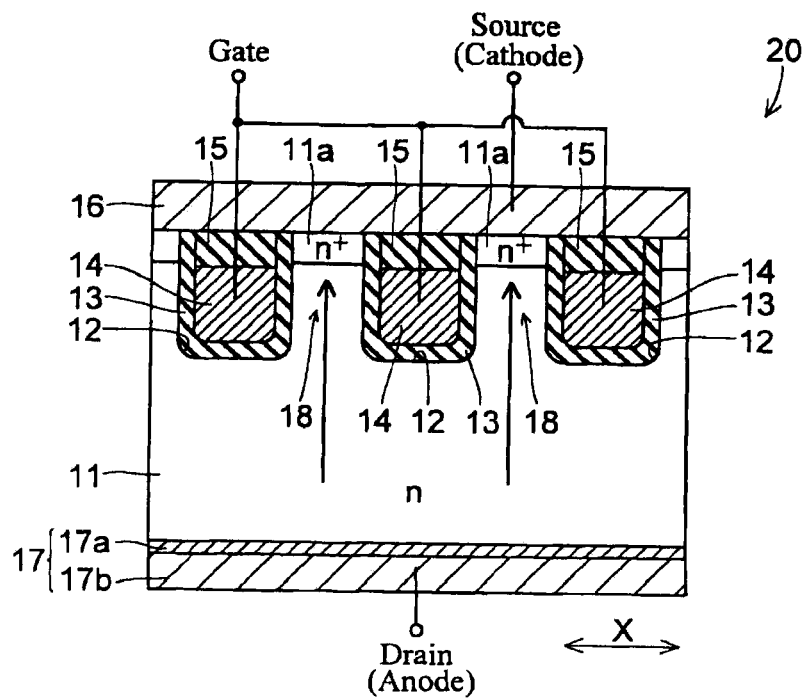
FIG. 9 is a cross sectional view illustrating an operation of the semiconductor device according to the second embodiment of the present invention.

Next, with reference to FIGS. 8 and 9, an operation of the semiconductor device 20 that functions as a switch device according to the second embodiment will be described. FIG. 8 illustrates the case where the semiconductor device that functions as a switch device is turned off, and FIG. 9 illustrates the case where the semiconductor device that functions as a switch device is turned on.

Note that it is supposed in the following description that a negative potential is applied to the source electrode 16 while a positive potential is applied to the drain electrode 17.

First, if the semiconductor device 20 that functions as a switch device is turned off, as illustrated in FIG. 8, the applied voltage to the embedded electrode (gate electrode) 14 is controlled so that majority carrier existing in a periphery of the trench 12 filled with the embedded electrode (gate electrode) 14 is decreased. In this way, a depletion layer 19 is formed in the periphery of the trench 12.

In this case, in the region between the neighboring trenches 12, the depletion layers 19 formed around the neighboring trenches 12 are overlapped with each other. In other words, in the region between the neighboring trenches 12, the depletion layers 19 formed around the neighboring trenches 12 are connected to each other. Thus, the channel 18 is blocked with the depletion layer 19, so that the current flowing in the channel 18 can be interrupted. Therefore, the semiconductor device 20 that functions as a switch device is turned off. At the same time, occurrence of leak current in the portion having the Schottky contact (Schottky barrier diode) can be suppressed.

Next, if the semiconductor device 20 that functions as a switch device is to be switched from the turned-off state to the turned-on state, as illustrated FIG. 9, a predetermined positive potential (predetermined voltage) is applied to the embedded electrode (gate electrode) 14 so that the depletion layer 19 formed around the trench 12 (see FIG. 8) is deleted. In other words, the depletion layer 19 that blocks the channel 18 (see FIG. 8) is deleted. Thus, the current that passed through the portion having the Schottky contact (Schottky barrier diode) flows through the channel (current passage) 18 in the arrow direction in FIG. 9. Therefore, the semiconductor device 20 that functions as a switch device can be turned on.

In addition, if the semiconductor device 20 that functions as a switch device is to be switched from the turned-on state to the turned-off state, the application of the predetermined positive potential (predetermined voltage) to the embedded electrode (gate electrode) 14 is stopped. Thus, the state illustrated in FIG. 8 is restored, so that the semiconductor device 20 that functions as a switch device can be turned off.

Figure 10:
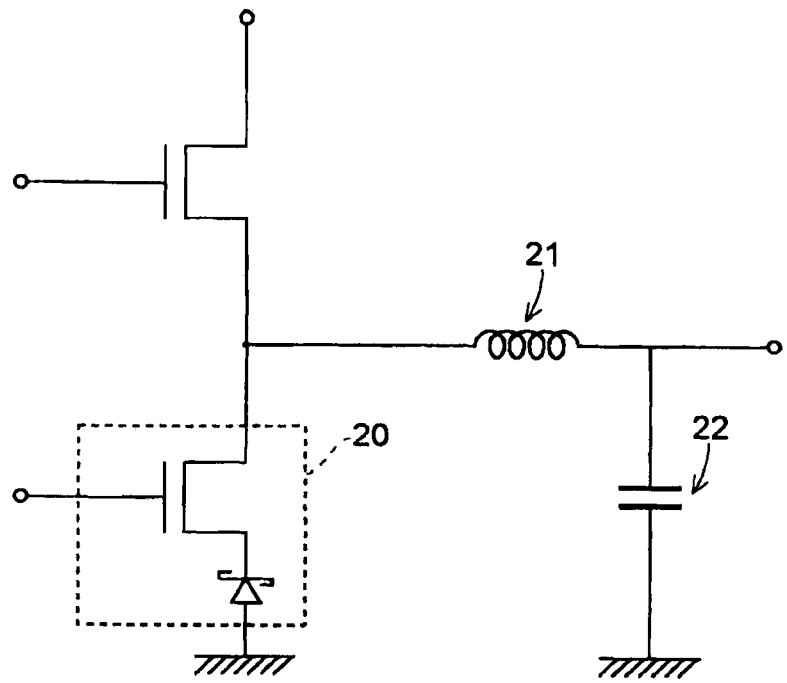
FIG. 10 is a circuit diagram illustrating an example of a DC/DC converter using the semiconductor device according to the second embodiment of the present invention.

Note that the semiconductor device 20 according to the second embodiment can be used as a part of components constituting a DC/DC converter as illustrated in FIG. 10. By using the semiconductor device 20 according to the second embodiment as a part of components constituting a DC/DC converter, power supply efficiency of the DC/DC converter can be improved. Here, numeral 21 in FIG. 10 denotes a coil, and numeral 22 denote a capacitor.

In the second embodiment, as described above, the channel 18 (each region between neighboring trenches 12) is blocked in every depletion layer 19 formed around each of the plurality of trenches 12, so that current is interrupted. On the other hand, all the depletion layers 19 formed around the plurality of trenches 12 are deleted so that current can flow. Thus, a formation state of the depletion layer 19 that is formed around the trench 12 changes in accordance with the applied voltage to the embedded electrode (gate electrode) 14. Therefore, by controlling the applied voltage to the embedded electrode (gate electrode) 14, it is possible to switch from the turned-on state (in which current flows through the channel 18) to the turned-off state (in which current flowing through the channel 18 is interrupted) and to switch in the opposite direction. In other words, the semiconductor device 20 can have the switching function. Further, in the above-mentioned structure, the entire portion of each region between the neighboring trenches 12 in which the depletion layer 19 is deleted can function as the current passage in the turned-on state, so the resistance against the current flowing through the channel 18 can be largely reduced compared with the conventional MOSFET (semiconductor device) in which a very thin inversion layer functions as the channel (current passage). Thus, the on-resistance can be largely reduced compared with the conventional MOSFET (semiconductor device) in which a very thin inversion layer functions as the channel (current passage).

In addition, in the second embodiment, as described above, the drain electrode 17 is formed on the lower surface of the n type silicon substrate 11 so as to have the Schottky contact with the lower surface of the n type silicon substrate 11, so that the Schottky barrier diode can be formed on the lower surface of the n type silicon substrate 11. Here, when the ohmic contact is to be formed between the drain electrode 17 and the n type silicon substrate 11, it is necessary to form the high concentration region on the lower surface of the n type silicon substrate 11. In contrast, when the Schottky contact is to be formed between the drain electrode 17 and the n type silicon substrate 11, the lower surface of the n type silicon substrate 11 can remain to be a low concentration region. Therefore, when the Schottky barrier diode is formed, it is not necessary to form the high concentration region on the lower surface of the n type silicon substrate 11, so that the step of doping the impurity at high concentration becomes needless. Thus, the number of manufacturing steps can be reduced. In other words, the semiconductor device 20 can be manufactured at low cost by forming the Schottky barrier diode.

In addition, in the second embodiment, as described above, the channel 18 (each region between the neighboring trenches 12) can be blocked with the depletion layer 19 formed around the trench 12, so the current flowing in the Schottky barrier diode can be interrupted. Thus, occurrence of leak current in the Schottky barrier diode can be suppressed. On the other hand, by deleting the depletion layer 19 formed around the trench 12, the current can flow in the Schottky barrier diode. As a result, by controlling turn on and off of the semiconductor device 20, the current flowing in the Schottky barrier diode can be controlled.

In addition, in the second embodiment, as described above, the drain electrode 17 is constituted of the multilayer structure including the barrier metal layer 17a that contacts directly with the n type silicon substrate 11, so that the drain electrode 17 can have the Schottky contact appropriately with the lower surface of the n type silicon substrate 11. Thus, the Schottky barrier diode can be formed easily.

In addition, in the second embodiment, as described above, the distance between the neighboring trenches 12 is set so that the depletion layers 19 formed around neighboring trenches 12 are overlapped with each other distance, so that the depletion layers 19 formed around neighboring trenches 12 can be connected securely to each other.

In addition, in the second embodiment, as described above, the interlayer insulator film 15 is embedded in the remaining part of the trench 12 that is not filled with the embedded electrode (gate electrode) 14 so that the upper surface thereof becomes flush with the upper surface of the n type silicon substrate 11. Thus, even if the distance between the neighboring trenches 12 is made to be small, the part of the n type silicon substrate 11 on the upper surface side (upper end portion of the region between the neighboring trenches 12 in the n type silicon substrate 11) is not entirely covered with the interlayer insulator film 15. Thus, the distance between the neighboring trenches 12 can be reduced, so that the depletion layers 19 formed around neighboring trenches 12 can easily be connected with each other.

Third Embodiment

Figure 11:
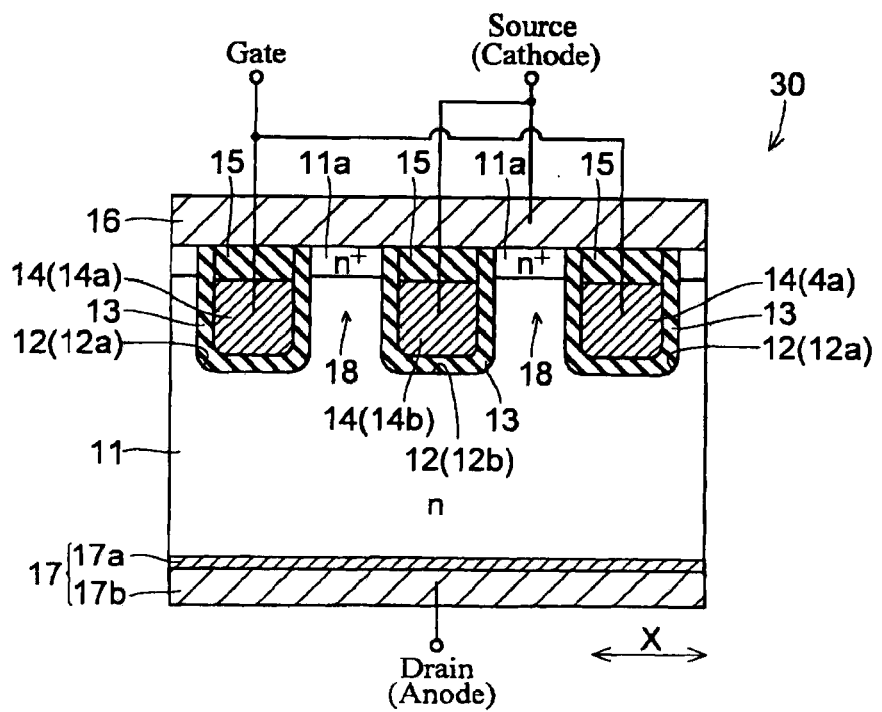
FIG. 11 is a cross sectional view illustrating connection positions of embedded electrodes of the semiconductor device according to a third embodiment of the present invention.

As illustrated in FIG. 11, a semiconductor device 30 according to a third embodiment includes the embedded electrode (gate electrode) 14 that is divided into two types of embedded electrodes 14a and 14b to which voltages are applied separately from each other. The embedded electrodes 14a of one type are applied with a voltage corresponding to a predetermined control signal. In addition, the embedded electrodes 14b of the other type are electrically connected to the source electrode 16. In other words, the embedded electrodes 14b of the other type have the same potential as the source electrode 16. In addition, the embedded electrodes 14a and 14b are disposed alternately one by one in the X direction. Therefore, one embedded electrode 14b (14a) is disposed between two embedded electrodes 14a (14b).

Note that other structure of the semiconductor device 30 according to the third embodiment is the same as the above-mentioned second embodiment.

Figure 12:
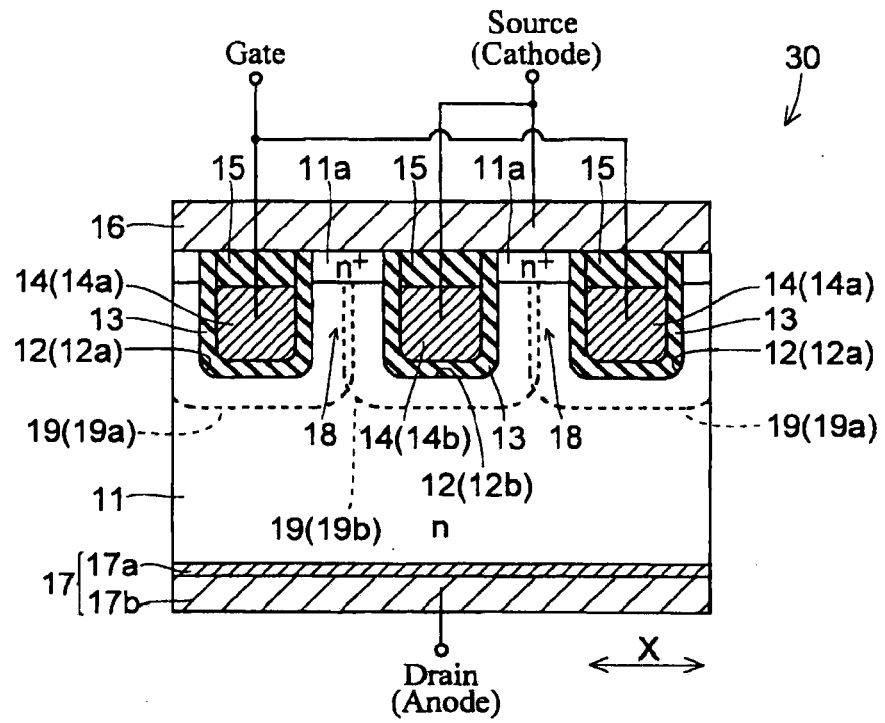
FIG. 12 is a cross sectional view illustrating an operation of the semiconductor device according to the third embodiment of the present invention.

Next, with reference to FIGS. 12 and 13, an operation of the semiconductor device 30 that functions as a switch device according to the third embodiment will be described. FIG. 12 illustrates the case where the semiconductor device that functions as a switch device is turned off, and FIG. 13 illustrates the case where the semiconductor device that functions as a switch device is turned on.

Figure 13:
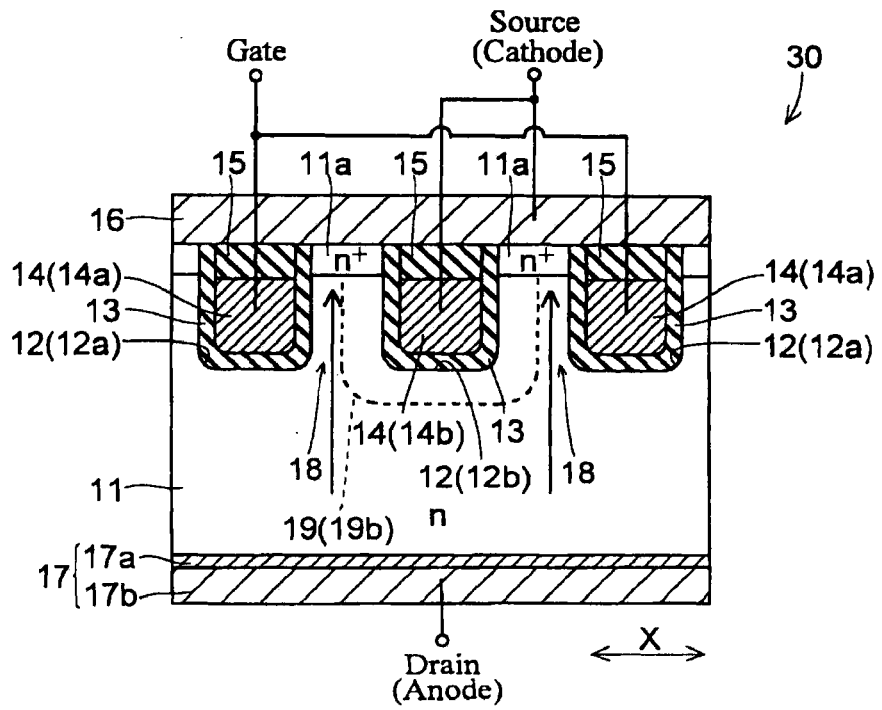
FIG. 13 is a cross sectional view illustrating an operation of the semiconductor device according to the third embodiment of the present invention.

First, as illustrated in FIGS. 12 and 13, it is supposed that a negative potential and a positive potential are applied to the source electrode 16 and the drain electrode 17, respectively. Then, because the embedded electrode 14b is electrically connected to the source electrode 16, the negative potential is applied to the embedded electrode 14b. Therefore, the periphery of the trench 12 filled with the embedded electrode 14b (hereinafter referred to as a trench 12b) is in the state where majority carrier is decreased. In other words, a depletion layer 19 (19b) is formed around the trench 12b regardless of the turned-on state or the turned-off state.

Further, as illustrated in FIG. 12, if the semiconductor device 30 is in the turned-off state, the applied voltage to the embedded electrode 14a is controlled so that the majority carrier existing around the trench 12 filled with the embedded electrode 14a (hereinafter referred to as a trench 12a) decreases. Thus, around the trench 12a, there is formed a depletion layer 19 (19a) that is similar to the depletion layer 19 (19b) that is formed around the trench 12b.

In this case, the depletion layers 19a and 19b formed around the trenches 12a and 12b are overlapped with each other in the region between the trenches 12a and 12b. In other words, in the region between the trenches 12a and 12b, the depletion layers 19a and 19b are connected to each other. Thus, the channel (current passage) 18 is blocked with the depletion layers 19a and 19b, so that the current flowing through the channel 18 can be interrupted. Therefore, the semiconductor device 30 that functions as a switch device is turned off. At the same time, occurrence of leak current in the portion having the Schottky contact (Schottky barrier diode) can be suppressed.

Next, as illustrated in FIG. 13, if the semiconductor device 30 that functions as a switch device is to be switched from the turned-off state to the turned-on state, a predetermined positive potential (predetermined voltage) is applied to the embedded electrode 14a so that a depletion layer 19a formed around the trench 12a (see FIG. 12) is deleted. In other words, the depletion layer 19a that blocks the channel 18 on the embedded electrode 14a (see FIG. 12) side is deleted. Thus, the current that passed through the portion having the Schottky contact (Schottky barrier diode) flows through the channel (current passage) 18 at the part on the embedded electrode 14a side in the arrow direction in FIG. 13. Therefore, the semiconductor device 30 that functions as a switch device can be turned on.

In addition, if the semiconductor device 30 that functions as a switch device is to be switched from the turned-on state to the turned-off state, the application of the predetermined positive potential (predetermined potential) to the embedded electrode 14a is stopped. Thus, the state illustrated in FIG. 12 is restored, so that the semiconductor device 30 that functions as a switch device can be turned off.

In the third embodiment, as described above, the channel 18 (each region between the neighboring trenches 12) is blocked with the depletion layer 19 that is formed around each of the plurality of trenches 12 so that the current is interrupt. On the other hand, at least a part of the depletion layers 19 formed around the plurality of trenches 12 (depletion layers 19a formed around the trenches 12a) is deleted so that the current can flow. Thus, a formation state of the depletion layer 19 that is formed around the trench 12 changes in accordance with the applied voltage to the embedded electrode 14. Therefore, by controlling the applied voltage to the embedded electrode 14, it is possible to switch from the turned-on state (in which current flows through the channel 18) to the turned-off state (in which current flowing through the channel 18 is interrupted) and to switch in the opposite direction. In other words, the semiconductor device 30 can have the switching function. Further, in the above-mentioned structure, the entire portion of each region between the neighboring trenches 12 in which the depletion layer 19 is deleted can function as the current passage in the turned-on state, so the resistance against the current flowing through the channel 18 can be largely reduced compared with the conventional MOSFET in which a very thin inversion layer functions as the channel (current passage). Thus, the on-resistance can be largely reduced compared with the conventional MOSFET in which a very thin inversion layer functions as the channel (current passage).

Note that other effects of the semiconductor device 30 according to the third embodiment are the same as those according to the second embodiment.

Figure 14:
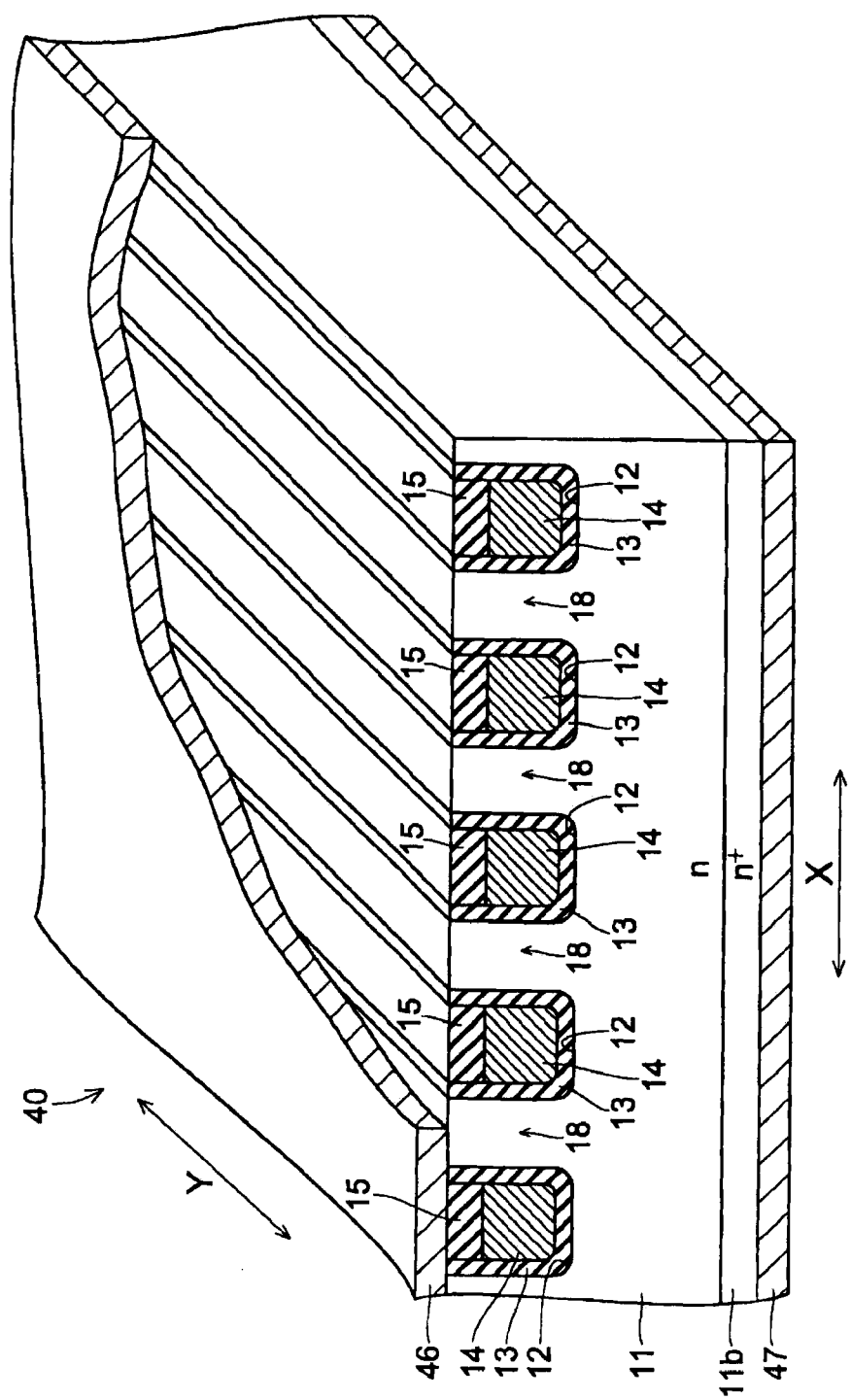
FIG. 14 is a cross sectional perspective view of a semiconductor device according to a variation example according to the second and the third embodiments of the present invention.
Figure 15:
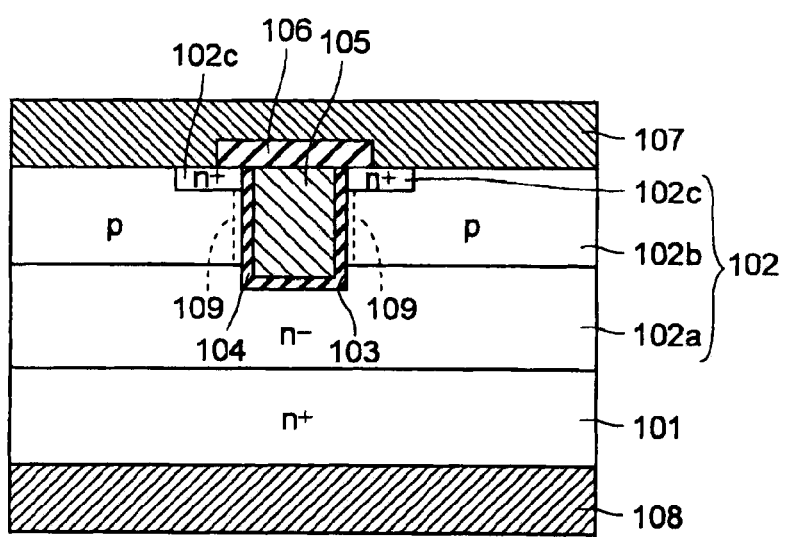
FIG. 15 is a cross sectional view illustrating a structure of a conventional MOSFET (semiconductor device).

As illustrated in FIG. 14, in the semiconductor device 40 according to the variation example of the second or the third embodiment, the Schottky barrier diode having the source electrode 46 as the anode electrode is formed on the upper surface of the n type silicon substrate 11. Specifically, in the semiconductor device 40 according to the variation example of the second or the third embodiment, unlike the semiconductor device 20 or 30 of the above-mentioned second or third embodiment, the high concentration region 11a (see FIGS. 5 and 11) is not formed in the part of the n type silicon substrate 11 on the upper surface side (upper end portion of each region between the neighboring trenches 12), so the upper surface of each region between the neighboring trenches 12 is a low concentration region. Then, the source electrode 46 is formed on the upper surface of the n type silicon substrate 11, so that the source electrode 46 has the Schottky contact with the upper surface of each region between the neighboring trenches 12 in the n type silicon substrate 11. Note that the source electrode 46 is an example of the "electrode layer" in the present invention. In addition, the source electrode 46 includes a barrier metal layer (not shown). The barrier metal layer (not shown) and the n type silicon substrate 11 contact directly with each other, so that the Schottky barrier diode is formed.

On the other hand, the part of the n type silicon substrate 11 on the lower surface side is provided with a high concentration region 11b that is formed by ion injection of n type impurity at high concentration so that the low concentration region is not exposed. The high concentration region 11b of the n type silicon substrate 11 is set to have a good ohmic contact with the drain electrode 47 that will be described later, and is higher than concentration in other part of the n type silicon substrate 11. Further, on the lower surface of the n type silicon substrate 11 (back surface), there is formed a drain electrode 47 including a multilayer structure in which a plurality of metal layers are laminated. The drain electrode 47 has an ohmic contact with the n type silicon substrate 11.

Other structure of the semiconductor device 40 according to the variation example of the second or the third embodiment is the same as that in the above-mentioned second or the third embodiment.

Note that the embodiments described above should be considered to be merely examples and should not be interpreted as a limitation. The scope of the present invention is defined not by the above description of the embodiments but by the claims, which includes every modification within the meaning and the range that are equivalent to the claims.

For instance, in the structure of the first embodiment, a plurality of trenches are formed in the n type epitaxial layer, so that each region between the neighboring trenches in the n type epitaxial layer functions as a channel, but the present invention is not limited to this structure. Another structure may be adopted in which a plurality of trenches are formed in the p type epitaxial layer, so that each region between the neighboring trenches in the p type epitaxial layer functions as a channel.

In addition, in the structure of the first embodiment, the depth of the trench is adapted to be smaller than the thickness of the n type epitaxial layer, but the present invention is not limited to this structure. Another structure may be adopted in which the trench penetrates the n type epitaxial layer and reaches the n⁺ type silicon substrate.

In addition, in the structure of the first embodiment, the upper surface of the interlayer insulator film is flush with the upper surface of the n type epitaxial layer, but the present invention is not limited to this structure. The upper surface of the interlayer insulator film may be positioned higher than the upper surface of the n type epitaxial layer, or the upper surface of the interlayer insulator film may be positioned lower than the upper surface of the n type epitaxial layer.

In addition, the second and the third embodiments exemplify the structure in which the trench or the like is formed in the n type silicon substrate, but the present invention is not limited to this structure. Another structure may be adopted in which the n type epitaxial layer is formed on the n type silicon substrate, and the trench or the like is formed in the n type epitaxial layer. In addition, after that, the n type silicon substrate may be removed by polishing or the like.

In addition, the second and the third embodiments exemplify the structure in which the upper surface of the interlayer insulator film formed on the upper surface of the embedded electrode is flush with the upper surface of the n type silicon substrate, but the present invention is not limited to this structure. The interlayer insulator film formed on the upper surface of the embedded electrode may be formed so that the upper surface thereof protrudes from the upper surface of the n type silicon substrate, or the upper surface thereof is positioned lower than the upper surface of the n type silicon substrate (inside the trench).

In addition, the second and the third embodiments exemplify the structure in which the n type silicon substrate (semiconductor layer) is used for constituting the semiconductor device, but the present invention is not limited to this structure. Another structure may be adopted in which the p type silicon substrate (semiconductor layer) is used for constituting the semiconductor device. In other words, another structure may be adopted in which all the conductivity types are reversed.

In addition, the second and the third embodiments exemplify the structure in which the silicon substrate is used as the substrate, but the present invention is not limited to this structure. A substrate (semiconductor substrate) constituted of SiC or the like may be used.

What is claimed is:

1. A semiconductor device comprising:
   a semiconductor layer of one conductivity type including a plurality of trenches arranged with predetermined spaces, each region between neighboring trenches providing a channel; and
   a plurality of embedded electrodes each of which is disposed on an inner surface of a respective one of the plurality of trenches via an insulator film so as to fill in each of the plurality of trenches,
   the semiconductor device switching between an on state and an off state according to a voltage applied to the plurality of embedded electrodes, wherein
   the insulator film is disposed along the inner surface of each of the plurality of trenches so as to cover the inner surface, including an inner bottom surface and an inner side surface, of each of the plurality of trenches,
   each semiconductor layer neighboring the plurality of trenches is of the one conductivity type,
   a distance between the neighboring trenches is at least 0.05 µm and not more than 0.3 µm,
   the plurality of embedded electrodes are on the inner surface of each of the plurality of trenches via the insulator film so as not to make contact with the semiconductor layer,
   a high concentration region is on an upper surface portion of the semiconductor layer, the high concentration region having a higher impurity concentration than another portion of the semiconductor layer where the high concentration region is not formed,
   the plurality of trenches penetrate the high concentration region from an upper-surface-portion side of the semiconductor layer,
   as seen in a depth direction of the trenches, a lower end portion of the high concentration region is positioned higher than an upper end portion of the embedded electrodes,
   the plurality of embedded electrodes are divided into two types of embedded electrodes, namely first embedded electrodes and second embedded electrodes, to which voltages are applied separately,
   the plurality of embedded electrodes are arranged with predetermined spaces between them such that one of the second embedded electrodes is located between two of the first embedded electrodes, and
   in the off state, each depletion layer formed around any of the plurality of trenches blocks a region between the neighboring trenches, and in the on state, a depletion layer, formed around any of the plurality of trenches in which the first type of embedded electrode is embedded, disappears to permit current to flow through the region between the neighboring trenches.

2. The semiconductor device according to claim 1 arranged such that when a predetermined voltage is applied to the embedded electrode, the depletion layer formed around the trench is deleted, and when application of the predetermined voltage to the embedded electrode is stopped, the depletion layer is formed around the trench.

3. The semiconductor device according to claim 1, wherein the depletion layers formed around the neighboring trenches are connected to each other when the current flowing through each region between the neighboring trenches is interrupted.

4. The semiconductor device according to claim 1, wherein a distance between the neighboring trenches is set so that the depletion layers formed around the neighboring trenches are overlapped with each other.

5. The semiconductor device according to claim 1, further comprising:
   an electrode layer on an upper surface of the semiconductor layer so as to cover an opening end of the trench; and
   an interlayer insulator film for insulating between the embedded electrode and the electrode layer, wherein
   the embedded electrode fills the trench to a halfway depth, and
   the interlayer insulator film fills the remaining part of the trench, so that an upper surface of the interlayer insulator film is flush with the upper surface of the semiconductor layer.

6. A semiconductor device comprising:
   a semiconductor layer of one conductivity type including a plurality of trenches arranged with predetermined spaces, each of the trenches having an opening end on an upper surface side, so that each region between neighboring trenches providing a current passage;
   a plurality of embedded electrodes each of which is on an inner surface of a respective one of the plurality of trenches via an insulator film so as to fill in each of the plurality of trenches in the semiconductor layer; and
   an electrode layer disposed on one of an upper surface or a lower surface of the semiconductor layer so as to provide a Schottky contact with the semiconductor layer,
   the semiconductor device switching between an on state and an off state according to a voltage applied to the plurality of embedded electrodes, wherein the insulator film is disposed along the inner surface of each of the plurality of trenches so as to cover the inner surface, including an inner bottom surface and an inner side surface, of each of the plurality of trenches, each semiconductor layer neighboring the plurality of trenches is of the one conductivity type, a distance between the neighboring trenches is at least 0.05 μm and not more than 0.3 μm, the plurality of embedded electrodes are on the inner surface of each of the plurality of trenches via the insulator film so as not to make contact with the semiconductor layer, a high concentration region is on an upper surface portion of the semiconductor layer, the high concentration region having a higher impurity concentration than another portion of the semiconductor layer where the high concentration region is not formed, the plurality of trenches penetrate the high concentration region from an upper-surface-portion side of the semiconductor layer, as seen in a depth direction of the trenches, a lower end portion of the high concentration region is positioned higher than an upper end portion of the embedded electrodes, the plurality of embedded electrodes are divided into two types of embedded electrodes, namely first embedded electrodes and second embedded electrodes, to which voltages are applied separately, the plurality of embedded electrodes are arranged with predetermined spaces between them such that one of the second embedded electrodes is located between two of the first embedded electrodes, in the off state, each depletion layer formed around any of the plurality of trenches blocks a region between the neighboring trenches, and in the on state, a depletion layer, formed around any of the plurality of trenches in which the first type of embedded electrode is embedded, disappears to permit current to flow through the region between the neighboring trenches, and if the electrode layer is on the upper surface side of the semiconductor layer, the electrode layer has the Schottky contact with the upper surface of each region between the neighboring trenches in the semiconductor layer, whereas if the electrode layer is on the lower surface side of the semiconductor layer, the electrode layer has the Schottky contact with the lower surface of the semiconductor layer.

7. The semiconductor device according to claim 6, wherein the electrode layer includes a barrier metal layer in contact with the semiconductor layer.

8. The semiconductor device according to claim 6, wherein a distance between the neighboring trenches is set so that the depletion layers formed around the neighboring trenches are overlapped with each other.

9. The semiconductor device according to claim 6, further comprising an interlayer insulator film on an upper surface of the embedded electrode, wherein the embedded electrode fills the trench to a halfway depth, and the interlayer insulator film fills the remaining part of the trench, so that an upper surface of the interlayer insulator film is flush with the upper surface of the semiconductor layer.

* * * * *